United States Patent
Kim et al.

(10) Patent No.: US 9,704,857 B2
(45) Date of Patent: *Jul. 11, 2017

(54) SEMICONDUCTOR DEVICE AND METHOD OF FORMING RF FEM WITH LC FILTER AND IPD FILTER OVER SUBSTRATE

(71) Applicant: STATS ChipPAC, Ltd., Singapore (SG)

(72) Inventors: HyunTai Kim, Kyungki Do (KR); YongTaek Lee, Seoul (KR); Gwang Kim, Kyungki Do (KR); ByungHoon Ahn, Kyungki-Do (KR); Kai Liu, Phoenix, AZ (US)

(73) Assignee: STATS ChipPAC, Pte. Ltd., Singapore (SG)

( * ) Notice: Subject to any disclaimer, the term of this patent is extended or adjusted under 35 U.S.C. 154(b) by 683 days.

This patent is subject to a terminal disclaimer.

(21) Appl. No.: 13/678,134

(22) Filed: Nov. 15, 2012

(65) Prior Publication Data
US 2013/0069197 A1 Mar. 21, 2013

Related U.S. Application Data

(62) Division of application No. 12/816,225, filed on Jun. 15, 2010, now Pat. No. 8,349,648.

(51) Int. Cl.
*H01G 9/00* (2006.01)
*H01L 21/00* (2006.01)
(Continued)

(52) U.S. Cl.
CPC .......... *H01L 27/0676* (2013.01); *H01L 21/56* (2013.01); *H01L 23/3121* (2013.01);
(Continued)

(58) Field of Classification Search
CPC ..... H01L 23/64; H01L 23/642; H01L 23/645; H01L 23/66
See application file for complete search history.

(56) References Cited

U.S. PATENT DOCUMENTS 5,164,690 A 11/1992 Yeh et al.
6,745,046 B1 6/2004 Eckert et al.
(Continued)

FOREIGN PATENT DOCUMENTS

CN 1339199 A 3/2002
CN 101730209 A 6/2010
(Continued)

*Primary Examiner* — Seahvosh Nikmanesh
(74) *Attorney, Agent, or Firm* — Robert D. Atkins; Patent Law Group: Atkins and Associates, P.C.

(57) ABSTRACT

A semiconductor device has a substrate and RF FEM formed over the substrate. The RF FEM includes an LC low-pass filter having an input coupled for receiving a transmit signal. A Tx/Rx switch has a first terminal coupled to an output of the LC filter. A diplexer has a first terminal coupled to a second terminal of the Tx/Rx switch and a second terminal for providing an RF signal. An IPD band-pass filter has an input coupled to a third terminal of the Tx/Rx switch and an output providing a receive signal. The LC filter includes conductive traces wound to exhibit inductive and mutual inductive properties and capacitors coupled to the conductive traces. The IPD filter includes conductive traces wound to exhibit inductive and mutual inductive properties and capacitors coupled to the conductive traces. The RF FEM substrate can be stacked over a semiconductor package containing an RF transceiver.

23 Claims, 8 Drawing Sheets

(51) Int. Cl.

| | | |
|---|---|---|
| *H01L 27/06* | (2006.01) | |
| *H01L 21/56* | (2006.01) | |
| *H01L 23/31* | (2006.01) | |
| *H01L 23/64* | (2006.01) | |
| *H01L 23/66* | (2006.01) | |
| *H01L 27/01* | (2006.01) | |
| *H01L 49/02* | (2006.01) | |
| *H01L 27/08* | (2006.01) | |
| *H01L 23/00* | (2006.01) | |

(52) U.S. Cl.
CPC ........ *H01L 23/3128* (2013.01); *H01L 23/642* (2013.01); *H01L 23/645* (2013.01); *H01L 23/66* (2013.01); *H01L 24/73* (2013.01); *H01L 27/016* (2013.01); *H01L 27/0805* (2013.01); *H01L 28/10* (2013.01); *H01L 28/40* (2013.01); *H01L 21/563* (2013.01); *H01L 24/16* (2013.01); *H01L 24/48* (2013.01); *H01L 2223/6677* (2013.01); *H01L 2224/16145* (2013.01); *H01L 2224/16225* (2013.01); *H01L 2224/32145* (2013.01); *H01L 2224/48145* (2013.01); *H01L 2224/48227* (2013.01); *H01L 2224/48228* (2013.01); *H01L 2224/73204* (2013.01); *H01L 2224/73257* (2013.01); *H01L 2224/73265* (2013.01); *H01L 2225/0651* (2013.01); *H01L 2225/06506* (2013.01); *H01L 2225/06513* (2013.01); *H01L 2225/06517* (2013.01); *H01L 2924/00014* (2013.01); *H01L 2924/01078* (2013.01); *H01L 2924/01079* (2013.01); *H01L 2924/01322* (2013.01); *H01L 2924/09701* (2013.01); *H01L 2924/10252* (2013.01); *H01L 2924/10253* (2013.01); *H01L 2924/10329* (2013.01); *H01L 2924/12041* (2013.01); *H01L 2924/12042* (2013.01); *H01L 2924/1306* (2013.01); *H01L 2924/13091* (2013.01); *H01L 2924/14* (2013.01); *H01L 2924/1433* (2013.01); *H01L 2924/15174* (2013.01); *H01L 2924/15192* (2013.01); *H01L 2924/15311* (2013.01); *H01L 2924/181* (2013.01); *H01L 2924/19011* (2013.01); *H01L 2924/19041* (2013.01); *H01L 2924/19042* (2013.01); *H01L 2924/19043* (2013.01); *H01L 2924/19105* (2013.01); *H01L 2924/3011* (2013.01); *H01L 2924/30105* (2013.01); *H01L 2924/30107* (2013.01)

(56) References Cited

U.S. PATENT DOCUMENTS

| | | |
|---|---|---|
| 7,183,135 B2 | 2/2007 | Ogawa et al. |
| 7,741,162 B2 | 6/2010 | Ogawa et al. |
| 8,791,775 B2 * | 7/2014 | Liu .................... H01L 23/5223 333/185 |
| 2004/0232982 A1 * | 11/2004 | Ichitsubo ............... H01L 23/66 330/129 |
| 2005/0285794 A1 | 12/2005 | Tang et al. |
| 2006/0194550 A1 * | 8/2006 | Block .................... H04B 1/005 455/78 |
| 2007/0173210 A1 | 7/2007 | Cho |
| 2008/0084677 A1 | 4/2008 | Ho et al. |
| 2008/0252395 A1 | 10/2008 | Liu et al. |
| 2009/0117938 A1 | 5/2009 | Georgantas et al. |
| 2009/0167455 A1 | 7/2009 | Liu et al. |
| 2010/0026411 A1 | 2/2010 | Liu et al. |
| 2010/0093292 A1 | 4/2010 | Kim et al. |

FOREIGN PATENT DOCUMENTS

| | | |
|---|---|---|
| EP | 1705703 A2 | 9/2006 |
| KR | 20090018324 A | 2/2009 |
| TW | I249262 B | 2/2006 |
| TW | 200705644 | 2/2007 |
| TW | 200843342 A | 11/2008 |
| TW | 200939652 A | 9/2009 |
| TW | 201005768 A | 2/2010 |

* cited by examiner

SEMICONDUCTOR DEVICE AND METHOD OF FORMING RF FEM WITH LC FILTER AND IPD FILTER OVER SUBSTRATE

CLAIM TO DOMESTIC PRIORITY

The present application is a division of U.S. patent application Ser. No. 12/816,225, now U.S. Pat. No. 8,349,648, filed Jun. 15, 2010, which application is incorporated herein by reference.

FIELD OF THE INVENTION

The present invention relates in general to semiconductor devices and, more particularly, to a semiconductor device and method of forming an RF FEM with an LC filter and IPD filter over a substrate using an IPD process.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

Another goal of semiconductor manufacturing is to produce higher performance semiconductor devices. Increases in device performance can be accomplished by forming active components that are capable of operating at higher speeds. In high frequency applications, such as radio frequency (RF) wireless communications, integrated passive devices (IPDs) are often contained within the semiconductor device. Examples of IPDs include resistors, capacitors, and inductors. A typical RF system requires multiple IPDs in one or more semiconductor packages to perform the necessary electrical functions.

In a wireless RF system, an RF front end module (FEM) is coupled to an antenna for transmission and reception of wireless RF signals. The RF FEM separates and filters the transmit RF signal and receive RF signal to avoid conflict or cross-over between the RF signals. The separated transmit RF signal and receive RF signal are routed to or received from an RF transceiver for demodulation and conversion to baseband signals for further signal processing. The RF system can be part of a cellular telephone, PDA, or other wireless communication device.

FIG. 1 shows a block diagram of a conventional RF FEM 10 coupled to antenna 12. RF FEM 10 has a transmit section and receive section. In the transmit section, the transmit RF signal from the RF transceiver is routed to an input of power amplifier 14 to increase signal power and amplification. The output of power amplifier 14 is coupled to RF coupler 15 which detects the transmit signal power level. The transmit RF signal is filtered by LC filter 16 and routed to TX/RX switch 18 which switches between the transmit RF signal and receive RF signal. When selected by TX/RX switch 18, the transmit RF signal is routed to diplexer 20 which performs frequency multiplexing from two ports to one port for transmission by antenna 12.

In the receive section, the receive RF signal from antenna 12 is processed through diplexer 20 for frequency demultiplexing from one port to two ports. When selected by TX/RX switch 18, the receive RF signal is routed to surface acoustic wave (SAW) filter 22. SAW filter 22 converts an electrical signal to a mechanical wave using a piezoelectric crystal or ceramic. The mechanical wave is delayed by the piezoelectric structure to provide a narrow pass-band response by rejecting out-of-band signals. The filtered wave is converted back to an electrical signal and routed to the RF transceiver as the receive RF signal.

FIG. 2 shows a conventional semiconductor package 23 for implementing RF FEM 10. Substrate 24 is a multilayered low temperature co-fire ceramic (LTCC) laminate with a plurality of internal dielectric layers 26 and conductivity layers 28, such as silver or copper. LTCC substrate 24 includes internal passive components, such as resistor 30, capacitors 32, and inductors 34, as well as embedded RF circuits 36, within the multilayered substrate. A TX/RX switch die 38 and discrete resistor 40 are mounted to a top surface of LTCC substrate 24 and electrically connected to conductive layers 28. A SAW filter die 42 is mounted to LTCC substrate 24 and electrically connected to conductive layers 28. SAW filter 42 is relatively large due to its mechanical features, but can be placed in a recess formed in LTCC substrate 24 in an attempt to reduce the height of semiconductor package 23.

RF FEM 10, as implemented semiconductor package 23 with SAW filter die 42, represents a relatively bulky and complex structure and involves high manufacturing costs. As the demand for smaller packages and lower cost drives the market, additional work is needed to improve the RF FEM design.

SUMMARY OF THE INVENTION

A need exists for an RF FEM without a bulky SAW filter. Accordingly, in one embodiment, the present invention is a semiconductor device for a RF FEM comprising a substrate and LC filter disposed over the substrate and including an input coupled for receiving a transmit signal of the RF FEM and an output for providing a filtered transmit signal. An IPD filter is disposed over the substrate and including an input coupled for receiving a receive signal of the RF FEM and an output for providing a filtered receive signal.

In another embodiment, the present invention is a semiconductor device comprising a substrate and RF FEM disposed over the substrate. The RF FEM includes an LC filter coupled for receiving a transmit signal and providing a filtered transmit signal, and an IPD filter coupled for receiving a receive signal and providing a filtered receive signal.

In another embodiment, the present invention is a semiconductor device for a RF FEM comprising a substrate and first IPD filter disposed over the substrate for processing a transmit signal of the RF FEM, and second IPD filter disposed over the substrate for processing a receive signal of the RF FEM.

In another embodiment, the present invention is a semiconductor device comprising a substrate and RF FEM disposed over the substrate. The RF FEM includes a first IPD filter for processing a transmit signal and second IPD filter for processing a receive signal.

DETAILED DESCRIPTION OF THE DRAWINGS

Figure 1:
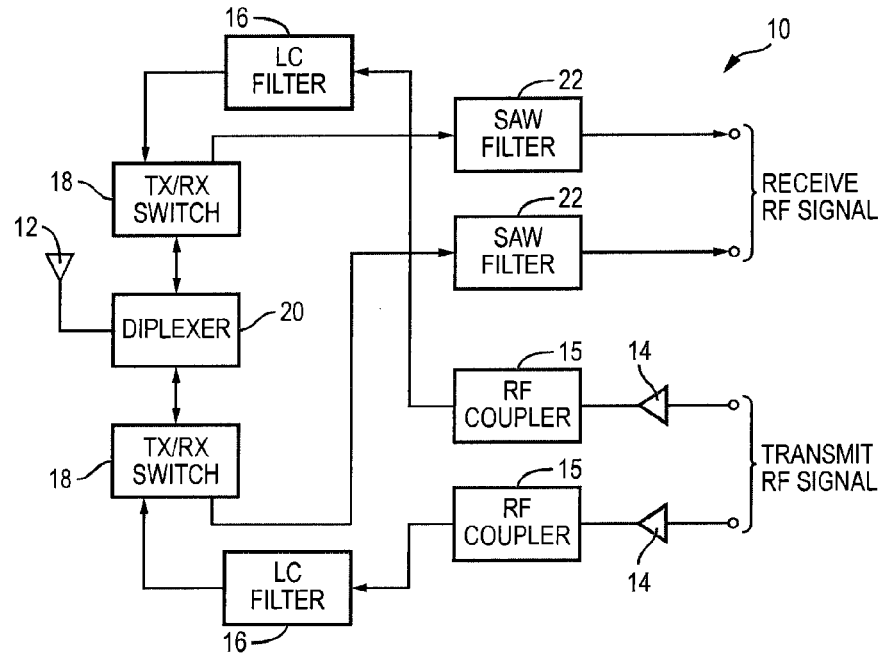
FIG. 1 illustrates a block diagram of a conventional RF FEM with a SAW filter.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface.

Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 3:
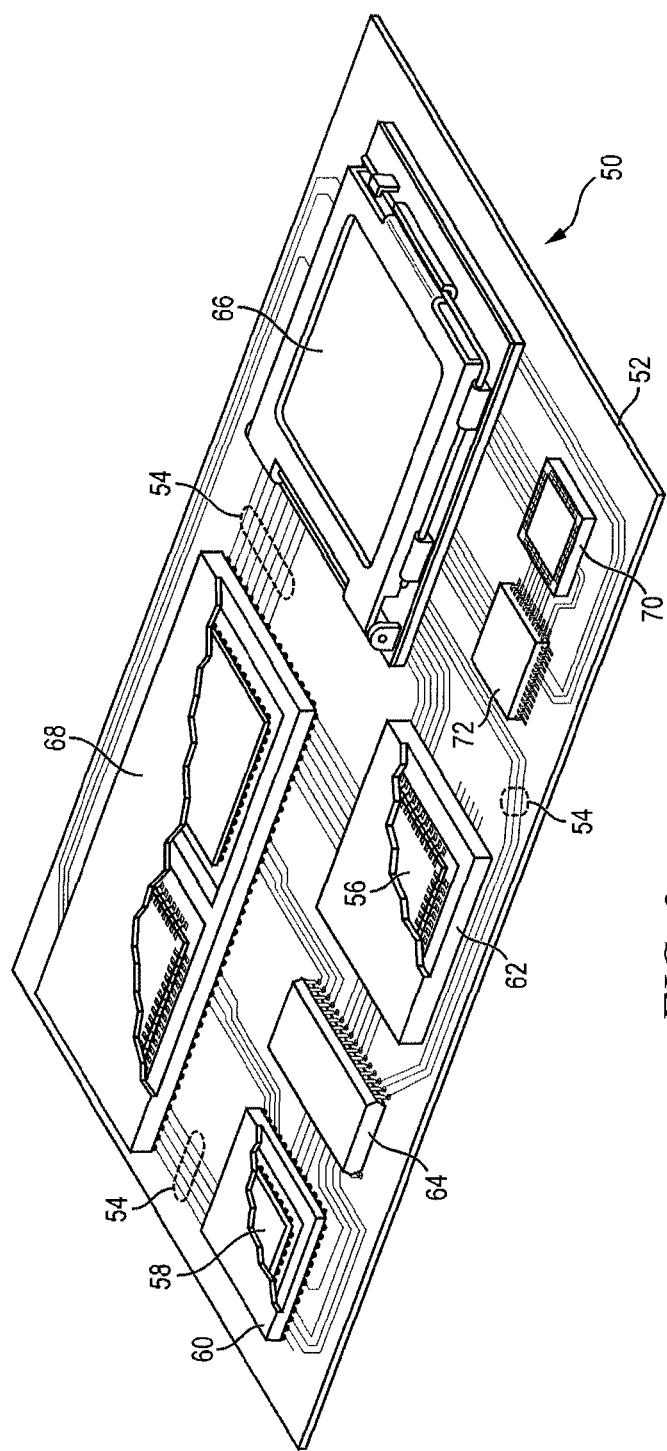
FIG. 3 illustrates a PCB with different types of packages mounted to its surface.

FIG. 3 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 3 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. The miniaturization and the weight reduction are essential for these products to be accepted by the market. The distance between semiconductor devices must be decreased to achieve higher density.

In FIG. 3, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 4A:
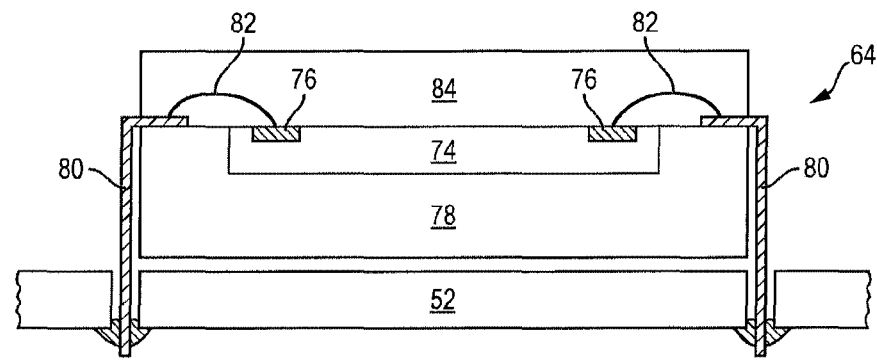
FIGS. 4a-4c illustrate further detail of the representative semiconductor packages mounted to the PCB.
Figure 4B:
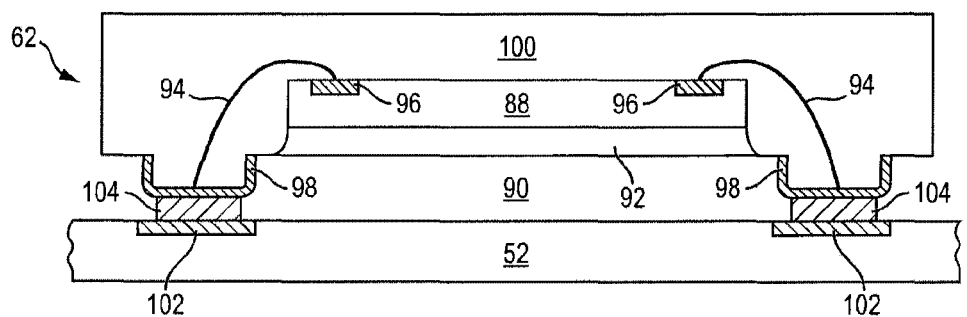
Figure 4C:
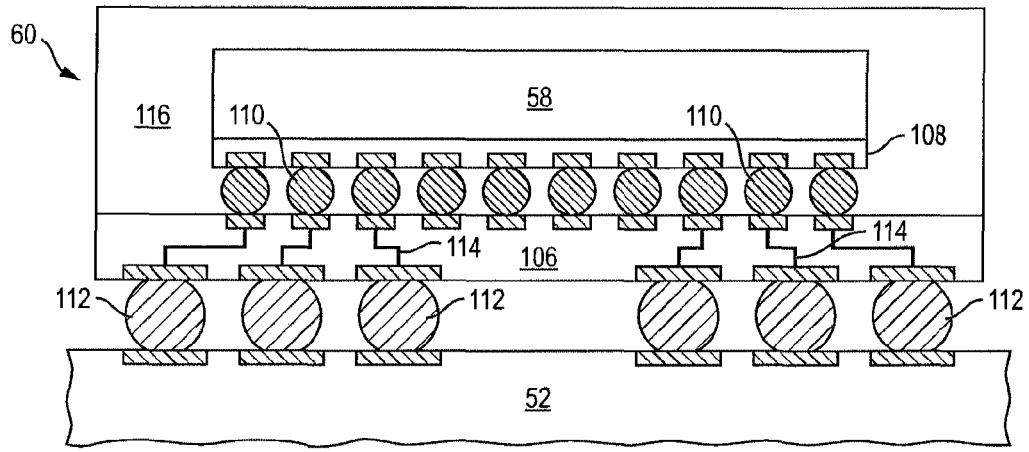

FIGS. 4a-4c show exemplary semiconductor packages. FIG. 4a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 4b illustrates further detail of BCC 62 mounted on PCB 52. Semiconductor die 88 is mounted over carrier 90 using an underfill or epoxy-resin adhesive material 92. Wire bonds 94 provide first level packaging interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 4c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 5:
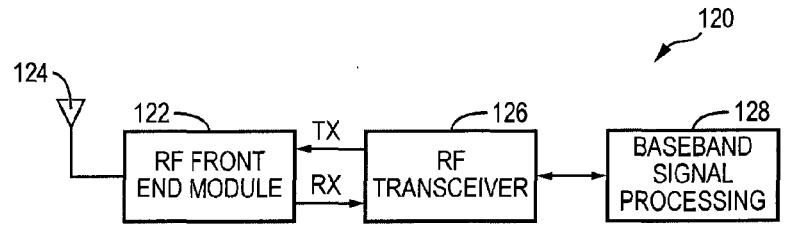
FIG. 5 illustrates an RF system for use in a wireless communication device.

FIG. 5 illustrates an RF system 120 including RF front end module (FEM) 122 coupled to antenna 124 for transmission and reception of wireless RF signals. RF FEM 122 separates and filters the transmit RF signal (Tx) and receive RF signal (Rx) to conflict or cross-over between the RF signals. The Tx signal and Rx signal are routed to and received from RF transceiver 126 for modulation and conversion to baseband signals. Baseband signal processing block 128 performs necessary electrical functions on the baseband signals. RF system 120 can be used in a cellular telephone, PDA, or other wireless communication device.

Figure 6:
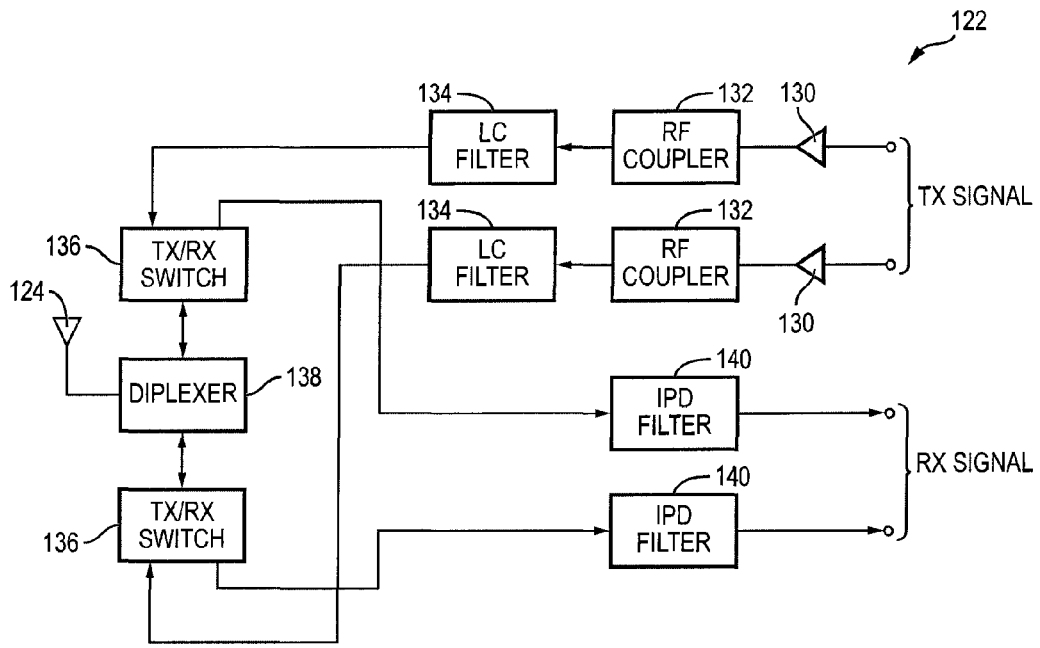
FIG. 6 illustrates a block diagram of the RF FEM in the RF system of FIG. 5.

FIG. 6 illustrates a block diagram of RF FEM 122. RF FEM 122 has a transmit section and receive section. In the transmit section, the Tx signal from RF transceiver 126 is routed to an input of power amplifier 130 to increase signal power and amplification. The output of power amplifier 130 is coupled to RF coupler 132 which detects the TX signal power level. The Tx signal is low-pass filtered by LC filter 134 and routed to Tx/Rx switch 136 which switches between the Tx signal and Rx signal. When selected by Tx/Rx switch 136, the Tx signal is routed to diplexer 138 which performs frequency multiplexing from two ports to one port for transmission by antenna 124.

In the receive section, the Rx signal from antenna 124 is processed through diplexer 138 for frequency de-multiplexing from one port to two ports. When selected by Tx/Rx switch 136, the Rx is routed to IPD filter 140 for band-pass filtering. The filtered Rx signal is routed to RF transceiver 126 for conversion to baseband for signal processing by block 128.

Figure 7:
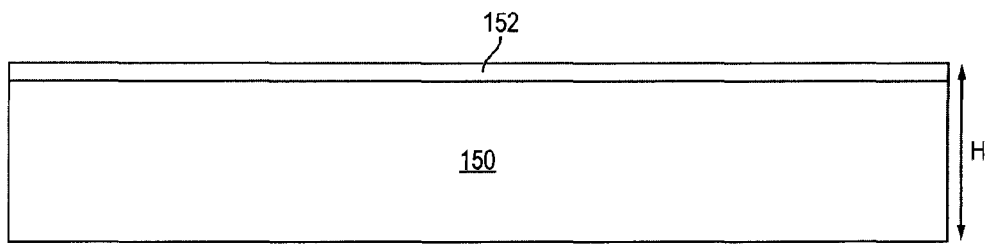
FIG. 7 illustrates a semiconductor substrate with an active surface.

FIG. 7 shows, in relation to FIGS. 3 and 4a-4c, a semiconductor substrate 150 containing a base material such as silicon, germanium, gallium arsenide, or other bulk semiconductor material for structural support. An active region 152 is formed over a surface of semiconductor substrate 150. Active region 152 contains analog or digital circuits implemented as active devices, passive devices, conductive layers, and dielectric layers formed within substrate 150 and electrically interconnected according to its electrical design and function. For example, the circuit may include one or more transistors, diodes, and other circuit elements formed within active surface 152 to implement analog circuits or digital circuits. Active region 152 occupies about 5-10% of the overall thickness or height H of semiconductor die 150. In one embodiment, semiconductor substrate 150 occupies an area 3.2 millimeters (mm) by 2.2 mm.

Figure 8:
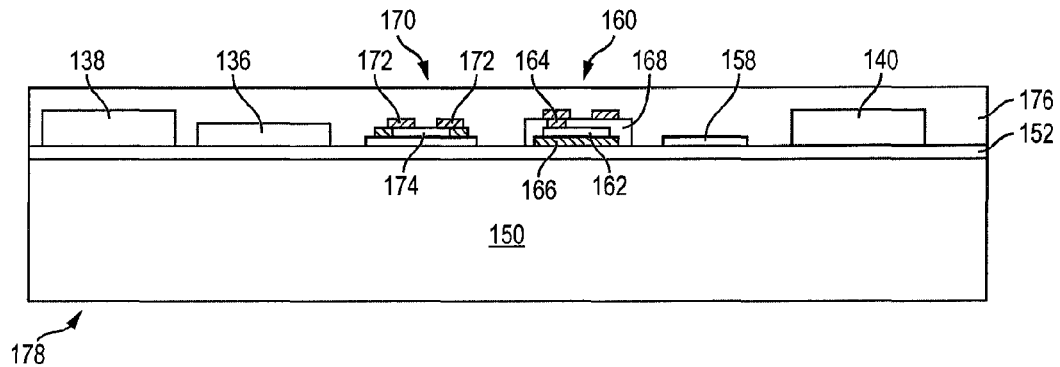
FIG. 8 illustrates a semiconductor package with IPD formed over the active surface of the semiconductor substrate.

FIG. 8 shows a plurality of IPDs, such as thin film inductors, capacitors, and resistors, as well as other semiconductor die or components, formed on or over active surface 152 for RF signal processing. In this embodiment, power amplifier 130 and RF coupler 132 are formed external to substrate 150. The IPD filter 140 is formed over active surface 152 of substrate 150. IPD 158 is a resistor formed over active surface 152. IPD 160 is a metal-insulator-metal (MIM) capacitor with dielectric layer 162 between metal layers 164 and 166 and covered by passivation layer 168. IPD 170 is an inductor with wound conductive layer 172 formed over passivation layer 174. The Tx/Rx switch 136 and diplexer 138 from FIG. 6 are formed over active surface 152. An encapsulant or molding compound 176 is deposited over components 136-170 and active surface 152 using a paste printing, compressive molding, transfer molding, liquid encapsulant molding, vacuum lamination, spin coating, or other suitable applicator. Encapsulant 176 can be polymer composite material, such as epoxy resin with filler, epoxy acrylate with filler, or polymer with proper filler. Encapsulant 176 is non-conductive and environmentally protects the semiconductor device from external elements and contaminants.

Semiconductor package 178 containing IPDs 140, 158, 160, and 170 and other RF signal processing components formed over common substrate 150 can be used in high frequency applications, such as microwave radar, telecommunications, wireless communication, electronic switches, and other devices performing RF electrical functions. The IPDs provide the electrical characteristics for circuit functions such as balanced unbalanced (baluns), resonators, high-pass filters, low-pass filters, band-pass filters (BPF), symmetric Hi-Q resonant transformers, matching networks, RF couplers, and tuning capacitors. For example, the IPDs can be used as front-end wireless RF components, which can be positioned between the antenna and transceiver. The wireless application can be a cellular phone using multiple band operation, such as wideband code division multiple access (WCDMA) bands (PCS, IMT, low) and global system mobile communication (GSM) bands (low and high).

Figure 9:
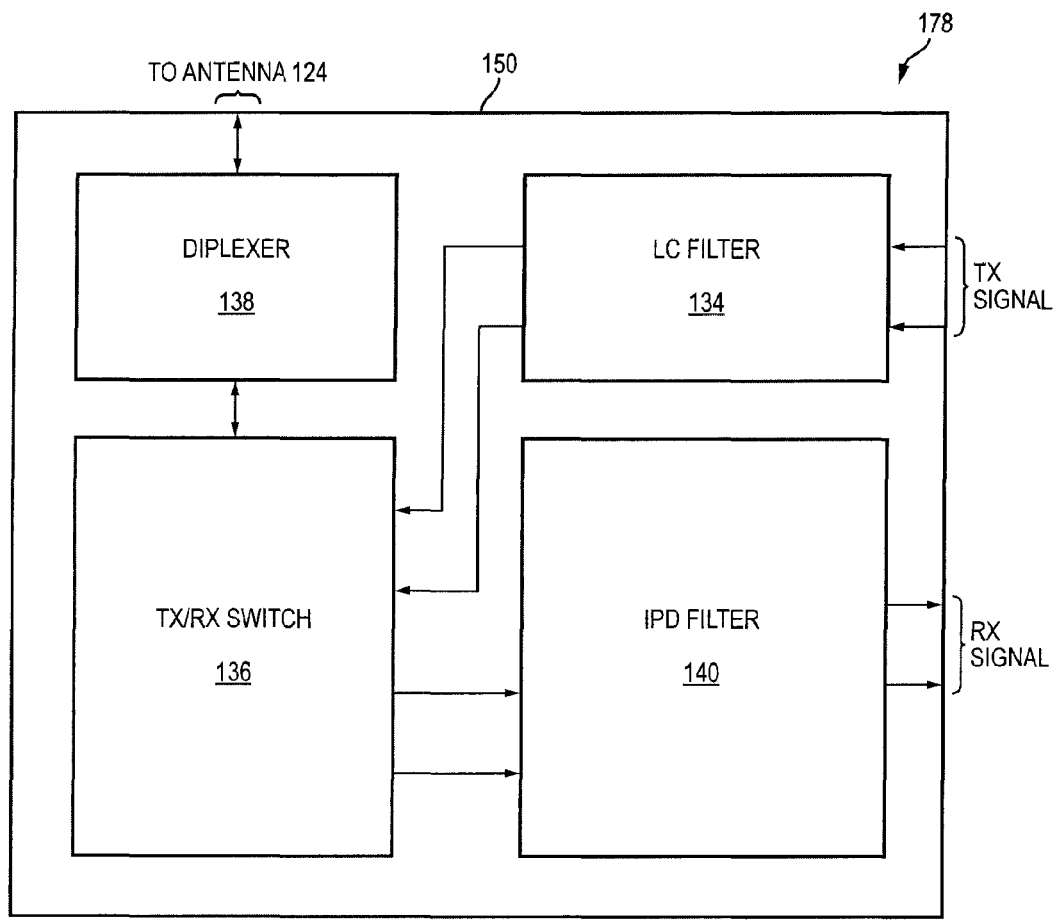
FIG. 9 illustrates a physical circuit layout of the RF FEM with LC filter and IPD filter.

FIG. 9 shows a top view physical layout of a portion of RF FEM 122 in a small form factor on common substrate 150 of semiconductor package 178. In the transmit section of substrate 150, LC filter 134 receives the Tx signal from power amplifier 130 and RF coupler 132. The filtered Tx signal is routed to Tx/Rx switch 136 and diplexer 138 for transmission in accordance with FIG. 6.

Figure 10:
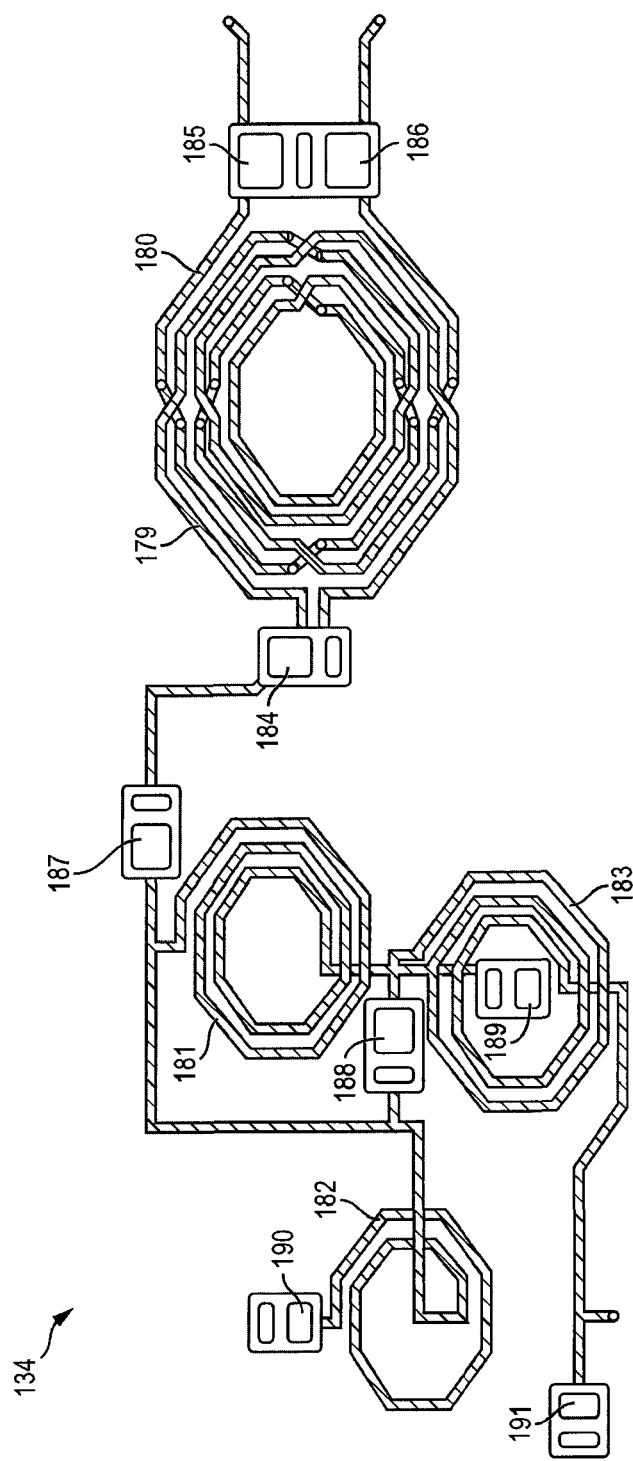
FIG. 10 illustrates a physical circuit layout of the LC filter.

FIG. 10 shows further detail of the physical layout of LC filter 134 including conductive traces or coils 179, 180, 181, 182, and 183, and capacitors 184, 185, 186, 187, 188, 189, and 191 in a balun or low-pass filter arrangement for the Tx signal. The conductive traces 179-183 are implemented with strip line conductive traces which are wound to exhibit inductive properties. The conductive traces can be one or more layers of Al, Cu, Sn, Ni, Au, Ag, or other suitable electrically conductive material formed using sputtering, electrolytic plating, electroless plating process, or other suitable metal deposition process. Capacitors 184-191 are implemented using a thin-film dielectric to increase capacitance density.

Figure 11:
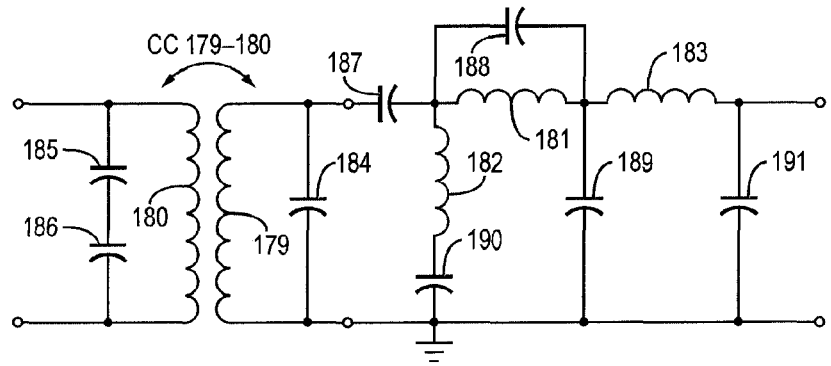
FIG. 11 illustrates a schematic diagram of the LC filter.

FIG. 11 shows an electrical schematic diagram of low-pass filter 134 with inductors 179-183 and capacitors 184-191. In particular, capacitor 184 is coupled between first and second end terminals of conductive trace 179. Capacitors 185 and 186 are coupled in series between first and second end terminals of conductive trace 180. Conductive traces 179 and 180 are interwoven to exhibit mutual inductive properties. The conductive traces 179-183 can be circular, oval, polygonal, or conformal shape for enhanced Q-factor and reduced die area.

Figure 12:
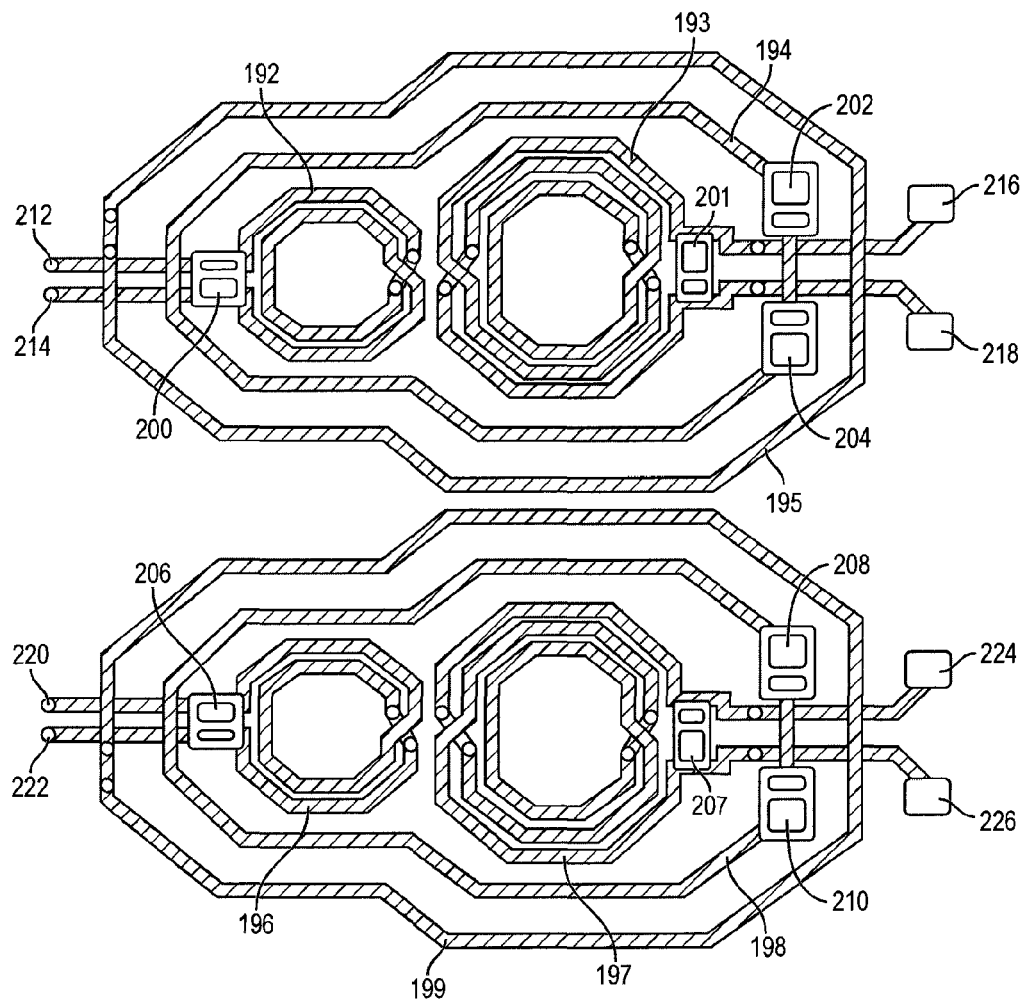
FIG. 12 illustrates a physical circuit layout of the IPD filter.

Returning to FIG. 9, in the receive section of substrate 150, the Rx signal is routed from diplexer 138 and Tx/Rx switch 136 to IPD filter 140. FIG. 12 shows further detail of IPD filter 140 including conductive traces or coils 192, 193, 194, 195, 196, 197, 198, and 199, and capacitors 200, 201, 202, 204, 206, 207, 208, and 210 in a band-pass filter arrangement for the Rx signal. The conductive traces 192-199 are implemented with strip line conductive traces which are wound and interwoven to exhibit inductive and mutual inductive properties. The conductive traces can be one or more layers of Al, Cu, Sn, Ni, Au, Ag, or other suitable electrically conductive material formed using sputtering, electrolytic plating, electroless plating process, or other suitable metal deposition process. Capacitors 200-210 are implemented using a thin-film dielectric to increase capacitance density.

The conductive trace 192 has first and second end terminals coupled to port 212 and port 214 for differential mode operation. In one embodiment, port 212 is a single-ended unbalanced port and port 214 is a ground terminal. Alternatively, port 212 is a single-ended unbalanced port and port 214 is the ground terminal. Capacitor 200 is coupled between port 212 and port 214. The conductive trace 193 has first and second end terminals coupled to balanced ports 216 and 218 for differential mode operation. Capacitor 201 is coupled between port 216 and port 218. Capacitors 202 and 204 are coupled in series between end terminals of conductive trace 194. The conductive trace 194 is disposed around a perimeter of conductive traces 192 and 193 in a non-overlapping arrangement with planar separation. Conductive trace 195 is formed around a perimeter of conductive trace 194 and connected to a low-impedance ground point to reduce inter-device interference and radiation loss. The conductive trace 192 is a different size and/or shape with respect to conductive trace 193. In one embodiment, conductive trace 192 is 30-50 micrometers (μm) in width with outer dimensions of 200-400 μm. Conductive trace 193 is 30-50 μm in width with outer dimensions of 400-600 μm. The conductive trace 192 is separated from conductive trace 193 by 100 μm; conductive trace 192 is separated from conductive trace 194 by 100 μm; conductive trace 193 is separated from conductive trace 194 by 100 μm. A mutual inductance is formed between conductive traces 192 and 193, between conductive traces 192 and 194, and conductive trace 193 and 194. The conductive traces 192 and 193 can be circular, oval, polygonal, or conformal shape for enhanced Q-factor and reduced die area. The different sized conductive trace 192 and 193 create different port impedance.

The conductive trace 196 has first and second end terminals coupled to port 220 and port 222 for differential mode operation. In one embodiment, port 220 is a single-ended unbalanced port and port 222 is a ground terminal. Alternatively, port 220 is a single-ended unbalanced port and port 222 is the ground terminal. Capacitor 206 is coupled between port 220 and port 222. The conductive trace 197 has first and second end terminals coupled to balanced ports 224 and 226 for differential mode operation. Capacitor 207 is coupled between port 224 and port 226. Capacitors 208 and 210 are coupled in series between end terminals of conductive trace 198. The conductive trace 198 is disposed around a perimeter of conductive traces 196 and 197 in a non-overlapping arrangement with planar separation. Conductive trace 199 is formed around a perimeter of conductive trace 198 and connected to a low-impedance ground point to reduce inter-device interference and radiation loss. The conductive trace 196 is a different size and/or shape with respect to conductive trace 197. In one embodiment, conductive trace 196 is 30-50 μm in width with outer dimensions of 200-400 μm. Conductive trace 197 is 30-50 μm in width with outer dimensions of 400-600 μm. The conductive trace 196 is separated from conductive trace 197 by 100 μm; conductive trace 196 is separated from conductive trace 198 by 100 μm; conductive trace 197 is separated from conductive trace 198 by 100 μm. A mutual inductance is formed between conductive traces 196 and 197, between conductive traces 196 and 198, and conductive trace 197 and 198. The conductive traces 196 and 197 can be circular, oval, polygonal, or conformal shape for enhanced Q-factor and reduced die area. The different sized conductive trace 196 and 197 create different port impedance.

Figure 13:
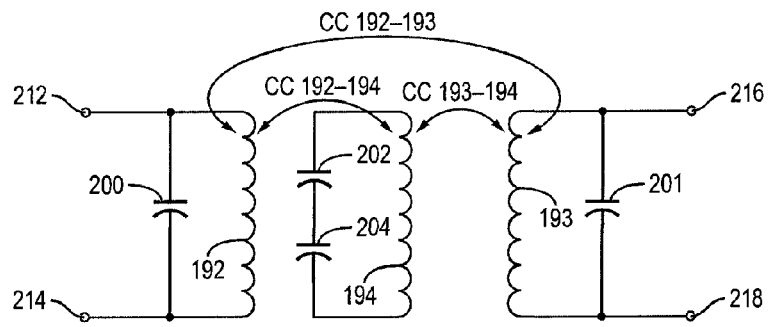
FIG. 13 illustrates a schematic diagram of the IPD filter.

FIG. 13 shows an electrical schematic diagram of IPD band-pass filter 140 with inductors 192, 193, and 194 and capacitors 200, 201, 202, and 204. The inductors 192-194 are wound to create relatively small magnetic coupling between the inductors for high attenuation in the rejection band. For example, the values of inductors 192, 193, and 194 are set to 1.89, 4.91, and 2.15 nanohenries (nH), respectively. The values of capacitor 200, 201, 202, and 204 are set to 1.97, 3.9, and 3.9 picofarads (pF), respectively. The arrows illustrate mutual inductance between inductors 192, 193, and 194. The coupling coefficients between inductors 192 and 193 are CC192-193=0.048, between inductors 193 and 194 are CC193-194=-0.148, and between inductors 192 and 194 are CC192-194=0.148. The coupling between inductors 192 and 194 decreases by increasing separation, resulting in a narrower band-pass response, particularly at the high frequency edge of the response. The coupling between inductors 193 and 194 increases by decreasing separation, and the attenuation pole at the lower side of the band-pass moves to a high frequency, resulting in a narrower bandwidth, with higher rejection. The inductors 196, 197, and 198, and capacitors 206, 207, 208, and 210 have a similar schematic representation.

Figure 14:
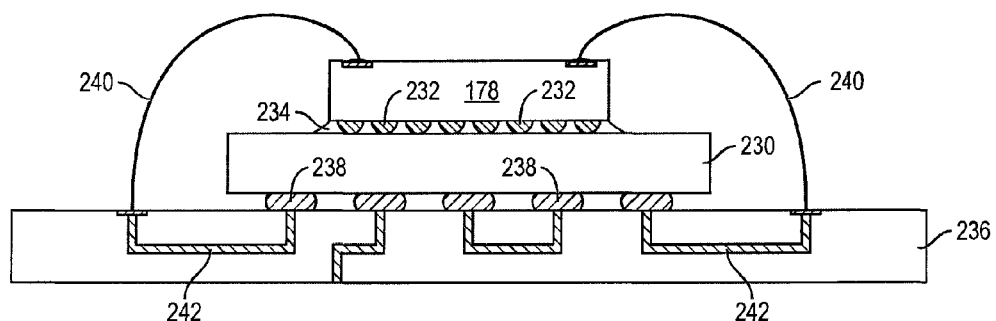
FIG. 14 illustrates the RF FEM semiconductor package mounted to an RF transceiver die.

FIG. 14 shows semiconductor package 178 containing RF FEM 122 mounted to semiconductor package 230 containing RF transceiver 126. Power amplifier 130 and RF coupler 132 can be integrated within semiconductor package 230 or implemented as separate components. Semiconductor package 178 is electrically connected to semiconductor package 230 with bumps 232. An underfill material 234 is deposited between semiconductor packages 178 and 230 around bumps 232. The stacked semiconductor packages 178 and 230 are mounted to laminate substrate 236 and electrically connected with bumps 238. Semiconductor package 178 is electrically connected to substrate 236 with bond wires 240. Substrate 236 includes a plurality of conductive traces 242 for signal routing between semiconductor packages 178 and 230, as well as external components.

Figure 2:
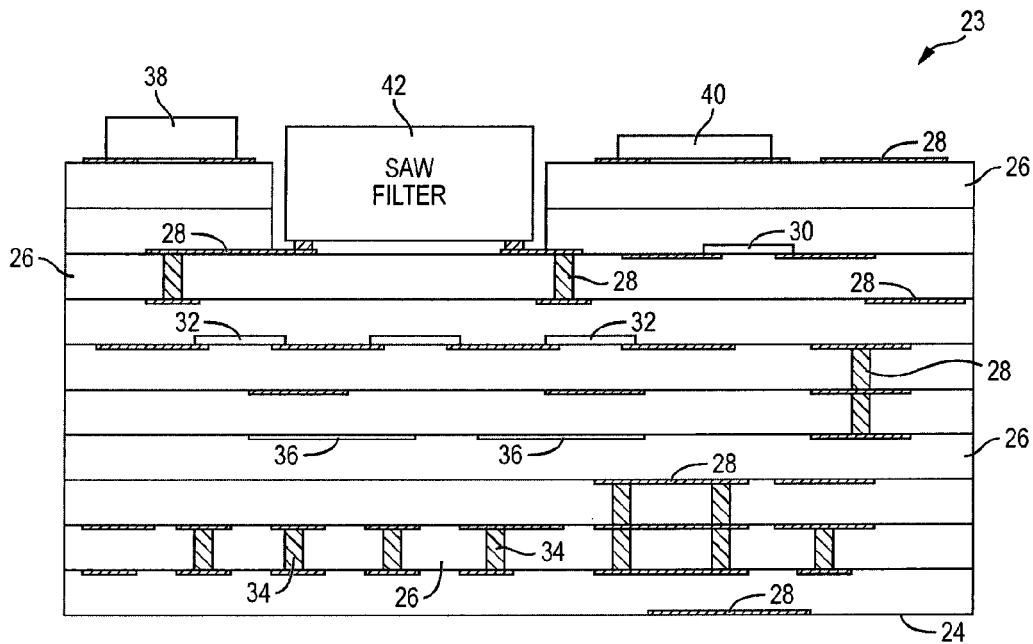
FIG. 2 illustrates a conventional LTCC substrate implementing the RF FEM with the SAW filter of FIG. 1.

As seen in FIGS. 6-13, RF FEM 122 can be implemented in low-cost semiconductor package 178 with LC filters 134 and IPD filters 140 providing processing channels for the Tx signal and Rx signal. Semiconductor package 178 is smaller and more cost effective as compared to the bulky SAW filter and LTCC substrate described in FIGS. 1-2.

Figure 15:
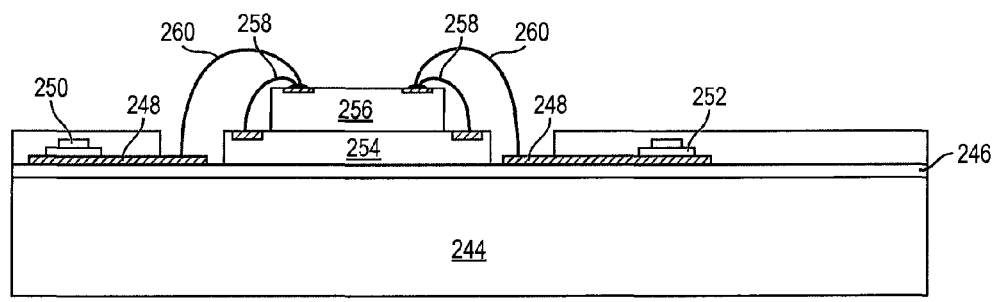
FIG. 15 illustrates the RF FEM semiconductor package mounted over a high resistivity substrate.

FIG. 15 shows an embodiment with high resistivity substrate 244. An insulating layer 246 is formed over substrate 244. A conductive layer 248 is formed over insulating layer 246. IPD 250 and 252, such as inductors, capacitors, and resistors, can be formed over conductive layer 248. A polyamide substrate 254 is formed over insulating layer 246. RF FEM 122 with IPD filter 140 is formed over substrate 254. A semiconductor package 256 containing RF components, such as power amplifier 130, RF coupler 132, Tx/Rx switch 136, diplexer 138, is mounted to substrate 254 and electrically connected with bond wires 258. Semiconductor package 256 is also electrically connected conductive layer 248 with bond wires 260.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device for a radio frequency front end module (RF FEM), comprising:
    a substrate including a semiconductor material;
    an inductor capacitor (LC) filter disposed over the substrate and including an input coupled for receiving a transmit signal of the RF FEM and an output for providing a filtered transmit signal; and
    an integrated passive device (IPD) filter disposed over the substrate and including an input coupled for receiving a receive signal of the RF FEM and an output for providing a filtered receive signal, wherein the IPD filter comprises,
        a first conductive trace wound to exhibit an inductive property and including first and second ends of the first conductive trace coupled to the input of the IPD filter,
        a second conductive trace disposed in proximity to the first conductive trace to exhibit a mutual inductive property and including first and second ends of the second conductive trace coupled to the output of the IPD filter, and
        a third conductive trace disposed around a perimeter of the first conductive trace and second conductive trace.

2. The semiconductor device of claim 1, further including:
    a transmit/receive (Tx/Rx) switch disposed over the substrate and including a first terminal coupled to the output of the LC filter and a second terminal coupled to the input of the IPD filter; and
    a diplexer disposed over the substrate and including a first terminal coupled to a third terminal of the Tx/Rx switch and a second terminal for providing an RF signal.

3. The semiconductor device of claim 1, wherein the IPD filter further includes:
    a first capacitor coupled between the first and second ends of the first conductive trace;
    a second capacitor coupled between the first and second ends of the second conductive trace; and
    a third capacitor coupled between the first and second ends of the third conductive trace.

4. The semiconductor device of claim 1, wherein the LC filter includes:
    a third conductive trace wound to exhibit an inductive property and including first and second ends coupled to the input of the LC filter; and
    a fourth conductive trace wound to exhibit an inductive property and including first and second ends coupled to the output of the LC filter, the fourth conductive trace being disposed in proximity to the third conductive trace to exhibit a mutual inductive property.

5. The semiconductor device of claim 4, wherein the LC filter further includes:
    a first capacitor coupled between the first and second ends of the third conductive trace; and
    a second capacitor coupled between the first and second ends of the fourth conductive trace.

6. A semiconductor device, comprising:
    a substrate;
    a radio frequency front end module (RF FEM) disposed over the substrate, the RF FEM including a first integrated passive device (IPD) filter for processing a transmit signal formed on the substrate and a second IPD filter for processing a receive signal formed on the substrate outside a footprint of the first IPD filter, wherein the second IPD filter includes:
        a first conductive trace wound to exhibit an inductive property and including first and second ends coupled to an input of the second IPD filter;
        a second conductive trace wound to exhibit an inductive property and including first and second ends coupled to an output of the second IPD filter, the second conductive trace being disposed in proximity to the first conductive trace to exhibit a mutual inductive property;
        a third conductive trace wound to exhibit an inductive property and disposed in proximity to the first and second conductive traces to exhibit a mutual inductive property;
        a first capacitor coupled between the first and second ends of the first conductive trace;
        a second capacitor coupled between the first and second ends of the second conductive trace; and
        a third capacitor coupled between the first and second ends of the third conductive trace.

7. The semiconductor device of claim 6, wherein the RF FEM further includes:
    a transmit/receive (Tx/Rx) switch including a first terminal coupled to an output of the first IPD filter and a second terminal coupled to an input of the second IPD filter; and
    a diplexer including a first terminal coupled to a third terminal of the Tx/Rx switch and a second terminal for providing an RF signal.

8. The semiconductor device of claim 6, wherein the first IPD filter includes:
    a first conductive trace wound to exhibit an inductive property and including first and second ends coupled to an input of the first IPD filter;
    a second conductive trace wound to exhibit an inductive property and including first and second ends coupled to an output of the first IPD filter, the second conductive trace being disposed in proximity to the first conductive trace to exhibit a mutual inductive property;

a first capacitor coupled between the first and second ends of the first conductive trace; and a second capacitor coupled between the first and second ends of the second conductive trace.

9. The semiconductor device of claim 6, further including an RF transceiver in a semiconductor package, wherein the substrate comprising the first IPD filter and second IPD filter is mounted over the semiconductor package and electrically connected to the RF transceiver.

10. A semiconductor device for a radio frequency front end module (RF FEM), comprising:

a substrate; and an integrated passive device (IPD) filter disposed over the substrate and including an input coupled for receiving a receive signal of the RF FEM and an output for providing a filtered receive signal, wherein the IPD filter comprises, a first conductive trace wound to exhibit an inductive property and including first and second ends of the first conductive trace coupled to the input of the IPD filter, a second conductive trace disposed in proximity to the first conductive trace to exhibit a mutual inductive property and including first and second ends of the second conductive trace coupled to the output of the IPD filter, and a third conductive trace disposed around a perimeter of the first conductive trace and second conductive trace.

11. The semiconductor device of claim 10, wherein the IPD filter further includes:

a first capacitor coupled between the first and second ends of the first conductive trace;

a second capacitor coupled between the first and second ends of the second conductive trace; and a third capacitor coupled between the first and second ends of the third conductive trace.

12. The semiconductor device of claim 10, further including an LC filter disposed over the substrate outside a footprint of the IPD filter.

13. The semiconductor device of claim 12, wherein the LC filter further includes:

a third conductive trace;

a fourth conductive trace configured to exhibit mutual inductance with the third conductive trace;

a first capacitor coupled between first and second ends of the third conductive trace; and a second capacitor coupled between first and second ends of the fourth conductive trace.

14. The semiconductor device of claim 10, further including an insulating layer formed over the IPD filter.

15. The semiconductor device of claim 14, further including a semiconductor package disposed on the insulating layer and including an RF component disposed in the semiconductor package.

16. The semiconductor device of claim 15, wherein the semiconductor package includes:

a transmit/receive (Tx/Rx) switch; and a diplexer.

17. A semiconductor device for a radio frequency front end module (RF FEM), comprising:

a substrate including a semiconductor material;

an inductor capacitor (LC) filter disposed over the substrate; and an integrated passive device (IPD) filter disposed over the substrate.

18. The semiconductor device of claim 17, wherein the IPD filter further includes:

a first conductive trace wound to exhibit an inductive property;

a second conductive trace disposed in proximity to the first conductive trace to exhibit a mutual inductive property; and a third conductive trace disposed around a perimeter of the first conductive trace and a perimeter of the second conductive trace.

19. The semiconductor device of claim 17, further including:

an insulating layer disposed over the substrate, LC filter, and IPD filter; and a semiconductor die including an amplifier disposed over the insulating layer.

20. The semiconductor device of claim 19, further including a bond wire coupled between the semiconductor die and substrate.

21. The semiconductor device of claim 19, wherein the insulating layer includes polyamide.

22. The semiconductor device of claim 17, wherein the substrate includes a high resistivity substrate.

23. The semiconductor device of claim 17, wherein the LC filter is disposed over the substrate outside a footprint of the IPD filter.

* * * * *